United States Patent
Romig et al.

(10) Patent No.: US 9,899,339 B2
(45) Date of Patent: Feb. 20, 2018

(54) DISCRETE DEVICE MOUNTED ON SUBSTRATE

(71) Applicant: Texas Instruments Incorporated, Dallas, TX (US)

(72) Inventors: Matthew David Romig, Richardson, TX (US); Lance Cole Wright, Allen, TX (US); Leslie Edward Stark, Rowlett, TX (US); Frank Stepniak, Allen, TX (US); Sreenivasan K. Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 470 days.

(21) Appl. No.: 13/668,901

(22) Filed: Nov. 5, 2012

(65) Prior Publication Data

US 2014/0124939 A1 May 8, 2014

(51) Int. Cl.
*H01L 21/60* (2006.01)
*H01L 23/64* (2006.01)
(Continued)

(52) U.S. Cl.
CPC ............. *H01L 23/64* (2013.01); *H01L 24/24* (2013.01); *H01L 24/73* (2013.01); *H01L 24/82* (2013.01); *H01L 24/83* (2013.01); *H01L 24/92* (2013.01); *H01L 23/5223* (2013.01); *H01L 23/5227* (2013.01); *H01L 23/5228* (2013.01);
(Continued)

(58) Field of Classification Search
None
See application file for complete search history.

(56) References Cited

U.S. PATENT DOCUMENTS 6,200,146 B1 * 3/2001 Sarkissian ............ H01R 13/035
439/79
6,544,864 B2 4/2003 Reeder et al.
(Continued)

OTHER PUBLICATIONS

Romig, Matthew David; Wright, Lance Cole; Stark, Leslie Edward; Stepniak, Frank; Koduri, Sreenivasan K., "Integrated Circuit Package With Printed Circuit Layer", U.S. Appl. No. 13/723,874, filed Dec. 21, 2012, 24 pages.

(Continued)

*Primary Examiner* — Jaehwan Oh
(74) *Attorney, Agent, or Firm* — Jacqueline J. Garner; Charles A. Brill; Frank D. Cimino

(57) ABSTRACT

A method of making an electronic device having a discrete device mounted on a surface of an electronic die with both the discrete device and the die connected by heat cured conductive ink and covered with cured encapsulant including placing the discrete device on the die; and keeping the temperature of each of the discrete device and the die below about 200° C. Also disclosed is a method of electrically attaching a discrete device to a substrate that includes placing the device on the substrate, applying conductive ink that connects at least one terminal on the device to at least one contact on the substrate and curing the conductive ink. Also disclosed is an IC package with a discrete electrical device having electrical terminals; an electrical substrate having contact pads on a surface thereof; and cured conductive ink connecting at least one of the electrical terminals with at least one of the contact pads.

9 Claims, 4 Drawing Sheets

(51) Int. Cl.
*H01L 23/00* (2006.01)
*H01L 23/522* (2006.01)
*H01L 23/532* (2006.01)

(52) U.S. Cl.
CPC .......... *H01L 23/5328* (2013.01); *H01L 24/29* (2013.01); *H01L 2224/245* (2013.01); *H01L 2224/2405* (2013.01); *H01L 2224/24011* (2013.01); *H01L 2224/24265* (2013.01); *H01L 2224/2919* (2013.01); *H01L 2224/73217* (2013.01); *H01L 2224/8121* (2013.01); *H01L 2224/81815* (2013.01); *H01L 2224/822* (2013.01); *H01L 2224/8221* (2013.01); *H01L 2224/8284* (2013.01); *H01L 2224/82102* (2013.01); *H01L 2224/82399* (2013.01); *H01L 2224/8321* (2013.01); *H01L 2224/83192* (2013.01); *H01L 2224/83862* (2013.01); *H01L 2224/92* (2013.01); *H01L 2224/92144* (2013.01); *H01L 2924/15747* (2013.01); *H01L 2924/181* (2013.01); *H01L 2924/19104* (2013.01)

(56) References Cited

U.S. PATENT DOCUMENTS

| | | | | |
|---|---|---|---|---|
| 9,691,691 | B2* | 6/2017 | Kim | H01L 23/49575 |
| 2008/0169574 | A1* | 7/2008 | Molkkari | H01L 21/563 |
| | | | | 257/782 |
| 2008/0303131 | A1* | 12/2008 | McElrea | H01L 24/24 |
| | | | | 257/686 |
| 2009/0230528 | A1* | 9/2009 | McElrea | H01L 24/24 |
| | | | | 257/676 |
| 2010/0040846 | A1* | 2/2010 | Bahnmuller | C09D 11/52 |
| | | | | 428/208 |
| 2010/0059251 | A1 | 3/2010 | Remizov et al. | |
| 2010/0123248 | A1* | 5/2010 | Yajima | C25D 5/10 |
| | | | | 257/741 |
| 2010/0149249 | A1* | 6/2010 | Baik | H05K 3/1208 |
| | | | | 347/21 |
| 2010/0178420 | A1 | 7/2010 | Lee et al. | |
| 2010/0244056 | A1 | 9/2010 | Ray et al. | |
| 2010/0320463 | A1 | 12/2010 | Rose et al. | |
| 2011/0042125 | A1 | 2/2011 | Lee et al. | |
| 2011/0115099 | A1* | 5/2011 | Karnezos | H01L 21/563 |
| | | | | 257/778 |
| 2011/0281405 | A1 | 11/2011 | Beer et al. | |
| 2012/0007253 | A1* | 1/2012 | Yang | H01L 23/481 |
| | | | | 257/774 |

OTHER PUBLICATIONS

Romig, Matthew David; Wright, Lance Cole; Stark, Leslie Edward; Stepniak, Frank; Koduri, Sreenivasan K., "Electronic Assembly With Three Dimensional Inkjet Printed Traces", U.S. Appl. No. 13/591,719, filed Aug. 22, 2012, 16 pages.

Mengel, Manfred; Nikitin, Ivan, "Inkjet Printed Dielectrics for Electronic Packaging of Chip Embedding Modules", Microelectronic Engineering 87 (2010), pp. 593-596, journal homepage: www.elsevier.com/locate/mee.

Kaija, Kimmo; Pekkanen, Ville; Mantysalo, Matti; Koskinen, Santtu; Niittynen, Juha; Halonen, Eerik; Mansikkamaki, Pauliina, "Inkjetting Dielectric Layer for Electronic Applications", Microelectronic Engineering 87 (2010), pp. 1984-1991, journal homepage: www.elsevier.com/locate/mee.

* cited by examiner

DISCRETE DEVICE MOUNTED ON SUBSTRATE

BACKGROUND

Integrated circuit ("IC") packages are ubiquitous in modern electronic devices. A typical integrated circuit package includes an IC die ("chip"), a lead frame and a layer of protective encapsulant. Lead frames are formed by cutting a pattern in a thin sheet of conductive material such as copper. Lead frames typically come in strip form with many identical lead frame patterns provided in a grid array on the strip.

An IC die (sometimes referred to herein simply as "die") is a small block of semiconductor material such as silicon in which an electrical circuit that performs a predetermined function is provided. Dies often have contact pads on a top surface that allow the die circuit to be connected to external circuits.

The usual method of forming IC packages includes mounting a number of identical dies on identical lead frame portions of a lead frame strip. After the dies are mounted on the lead frame strip, the dies are electrically connected to the corresponding lead frames. In a typical process, contact pads on the dies are electrically connected to predetermined regions on the corresponding lead frames by small thin wires by a process called wire bonding. In some cases it may be desirable to incorporate additional functionality into each die by attaching a discrete circuit device to the die. The discrete circuit device is often a passive circuit element, e.g. a capacitor, inductor or resistor. Or the discrete device may be a more complex circuit device, such as a sensor, a microelectromechanical system (MEMS), an oscillator or a smaller IC. The discrete circuit device is typically provided in a small box shaped configuration with a pair of external contacts that are attached to two contact pads on a corresponding die or other electrical substrate.

After wire bonding and attachment of the discrete circuit device(s) are completed the lead frame strips are moved to a mold station, such as a transfer mold station, where a mold compound is applied that covers the dies, wire bonds, discrete circuit device(s) and most of the surface of each of the lead frames. Small end portions of each lead frame are not coated with mold compound to provide exposed contacts for the subsequently formed IC packages. The applied mold compound is heated under pressure until it cures to a solid state. The cured mold compound or "encapsulant" protects the encapsulated portions of each lead frame and the associated die, wire bond connections and discrete device.

After curing of the mold compound, the lead frame strip is cut apart or "singulated" to separate the strip into individual IC packages. In one typical situation, each IC package includes an encapsulated die, wire bonds, discrete device, and an encapsulated lead frame with projecting electrical contacts.

DETAILED DESCRIPTION

Figure 1:
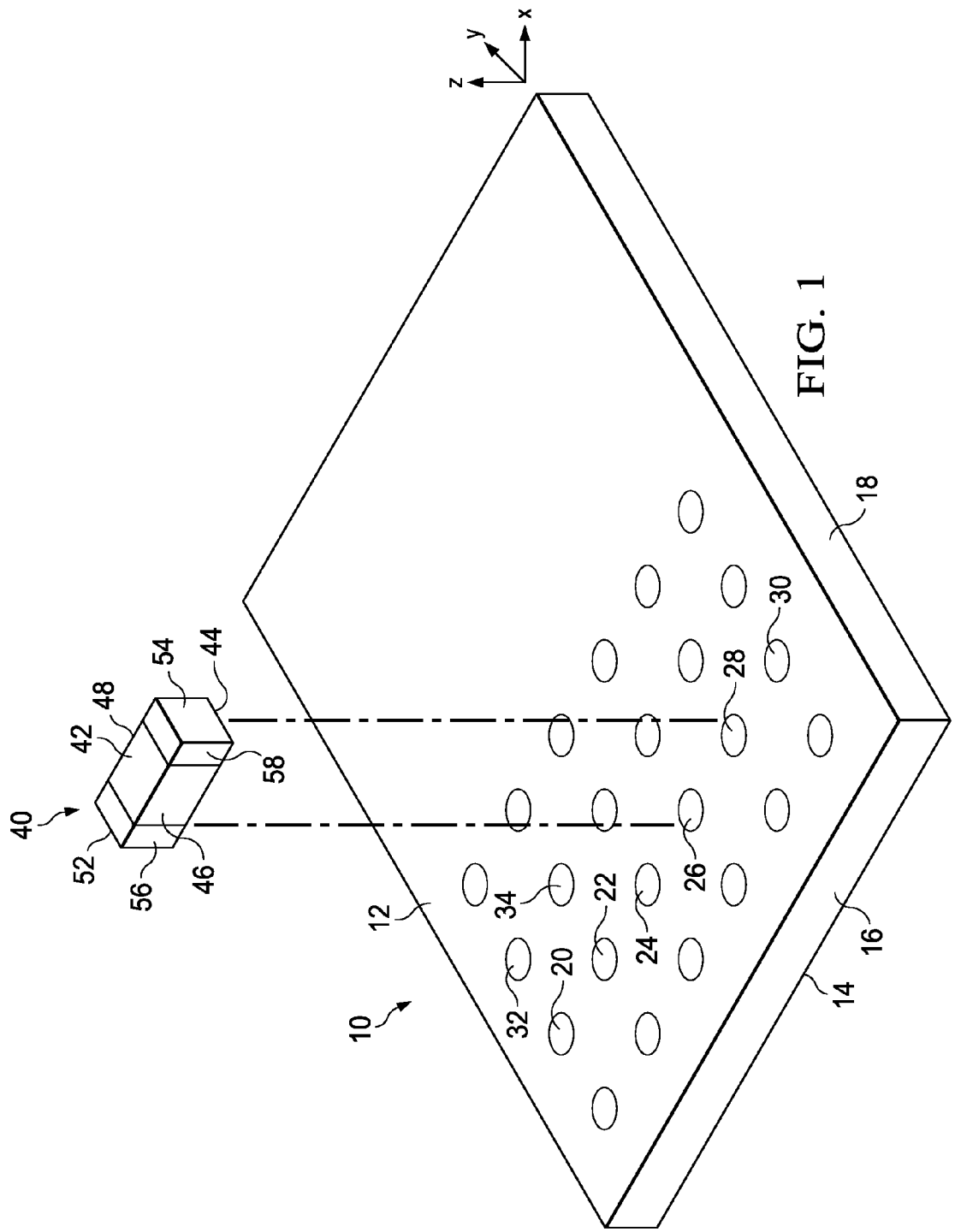
FIG. 1 is a top isometric view of a substrate and a discrete device which is to be mounted thereon.
Figure 2:
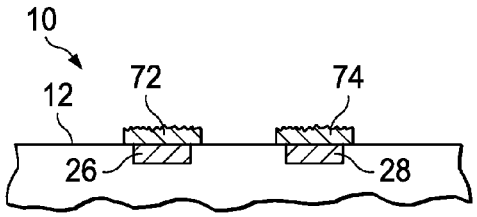
FIG. 2 is a cross sectional elevation view of a substrate with solder paste applied in solder paste patterns to conductor pad regions thereon.

FIGS. 6-17 disclose a method of electrically attaching a discrete circuit device 40 (sometimes referred to herein as "discrete device 40" or "device 40") to an electrical substrate 10, such as a die. The method includes placing the device 40 on the substrate 10 and printing at least one conductive ink pattern, e.g., 92, 94, that connects at least one terminal, e.g., 56, 58, on the device 40 that extends transversely of the substrate to at least one contact pad, e.g., 26, 28, on the substrate 10. The drawings also disclose, in FIGS. 10 and 16, an integrated circuit package 120 that comprises a discrete circuit device 40 having electrical terminals 56, 58 and a substrate 10 having contact pads, e.g., 26, 28, on a surface 12 thereof. Conductive ink patterns 96, 98 connect at least one of the electrical terminals 56, 58 with at least one of the contact pads 26, 28. The IC package 120 may have a protective coating of encapsulant 80. Having thus generally described an IC package and a method of attaching a discrete device to a substrate, various embodiments of IC packages and methods of production will be described in further detail below.

FIG. 1 is an isometric view of a substrate such as a die 10 having a top face surface 12, a bottom face surface 14, and edge face surfaces 16, 18, etc. Die 10 extends in lateral (X), longitudinal (Y), and vertical (Z) directions. A plurality of contact pads 20, 22, 24, 26, 28, 30, 32, 34, etc. are provided on the top face surface 12 for connecting internal circuitry of the die 10 to other electrical devices. A discrete circuit device 40 which may be a passive circuit element such as a resister, capacitor, or inductor is to be mounted on the substrate 10. The discrete circuit device 40 in the illustrated embodiment is generally box shaped and may have an exterior made from a ceramic or other insulator material. The die 10 has a top face surface 42, a bottom face surface 44, a front face surface 46, a back face surface 48, and two end face surfaces 52, 54. End portions of the discrete device 40 are plated with a conductive metal such as copper, silver, etc., which contact terminal ends of the internal circuitry (not shown) of the device 40 to provide external plated terminals 56, 58.

Figure 3:
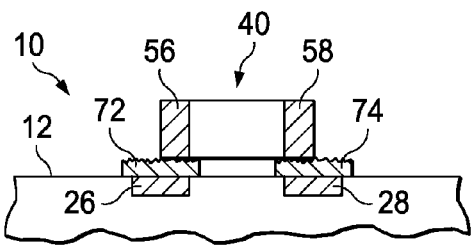
FIG. 3 is the cross sectional elevation view of FIG. 2 with a discrete device placed on the solder paste patterns
Figure 4:
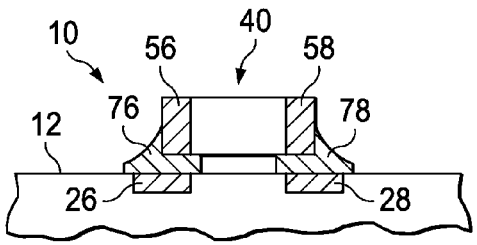
FIG. 4 is a cross sectional elevation view of a substrate with a discrete device attached thereto by solder joints.
Figure 5:
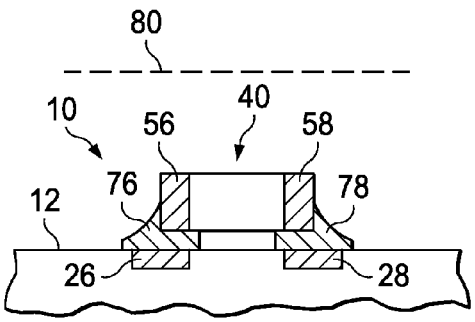
FIG. 5 is the cross sectional elevation view of FIG. 4 after encapsulation of the discrete device and substrate.

As used herein, the designations, lateral, longitudinal, vertical and similar terms do not imply orientation within any particular gravitational field but are used in a relative sense to describe the physical relationship of various portions of die 10 and a discrete circuit device 40 mounted. Terms such as up, down, above, below, sideways, etc. are used in this same relative sense in accordance with the axes shown in FIG. 1. The attachment of a discrete device 40 to a substrate 10 in a manner which is known in the art will now be described with reference to FIGS. 2-5. The method begins with placing solder paste patterns 72, 74 on two contact pads 26, 28. The solder paste is conventionally screen printed on the die and is generally done at the wafer level. Screen printing involves a considerable setup period and is ordinarily performed on multiple dies at once rather than one die at a time. As shown in FIG. 3, the discrete device 40 is then placed on the die 10 with the plated terminals 56, 58 on the device 40 engaging the printed solder paste patterns 72, 74. A pick and place machine is typically used for this purpose. Next, as shown in FIG. 4, the assembly of FIG. 3 is moved to a reflow oven which is typically operated at a temperature of between about 230° C. and 260° centigrade. The solder paste 72, 74 reflows in the reflow oven forming solder reflow joints 76, 78. Next, as illustrated in FIG. 5, the assembly of FIG. 4 is moved to a mold device such as a conventional transfer mold where the die 10 and discrete device 40 are covered by a layer of liquid encapsulant which cures into a hard, protective encapsulation layer 80.

Figure 6:
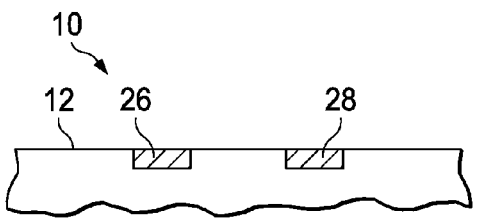
FIG. 6 is a cross sectional elevation view of a portion of a substrate including two die pads.
Figure 7:
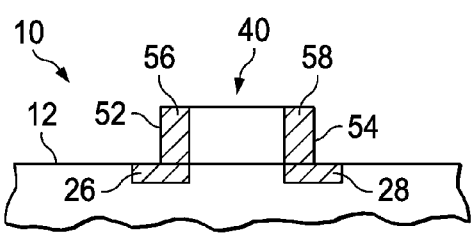
FIG. 7 is the cross sectional elevation view of FIG. 6 after placement of a discrete device on the substrate.
Figure 8:
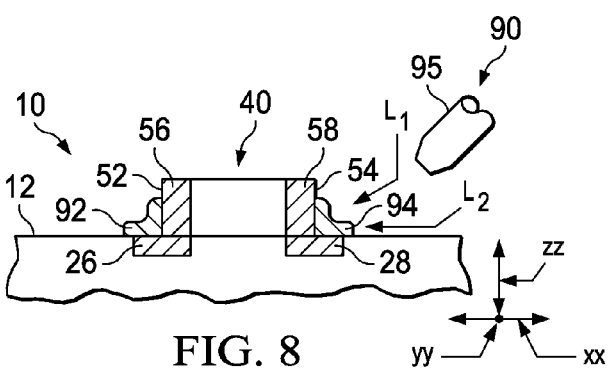
FIG. 8 is a cross sectional elevation view of the substrate and discrete device of FIG. 7 after printing of conductive ink patterns thereon.
Figure 8A:
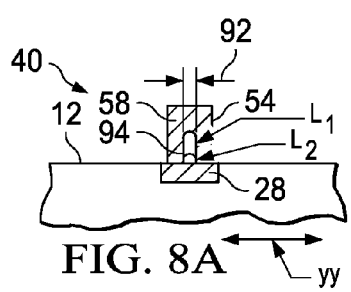
FIG. 8A is a partially cross sectional end view of the substrate and discrete device of FIG. 7 after printing of conductive ink patterns thereon.

FIGS. 6-10 illustrate a method of attaching a discrete device 40 to a die 10 which does not use solder and thus avoids the extreme heat of a reflow oven. FIG. 6 is a cross sectional elevation view of a portion of a substrate 10 such as a die having contact pads 26, 28. The first step of the process, as shown in FIG. 7, is to place the discrete device 40 on the substrate 10 as by use of a conventional pick and place machine or other mechanism. The device 40 is typically placed with plated terminals 56, 58 thereof contacting contact pads 26, 28 of the substrate. (However, in some embodiments (not shown) the plated terminals 56, 58 do not lie on the contact pads 26, 28). In the embodiment shown in FIG. 7, there is nothing holding the discrete device 40 to the substrate 10 other than gravity. Next, as illustrated in FIGS. 8, and 8A, generally L-shaped, printed conductive ink patterns 92, 94 are printed onto end faces 52, 54 of the plated portions 56, 58 and onto the contact pads 26, 28. The ink patterns 92, 94 may be ink jet printed as with a conventional ink jet printer 90, which in one embodiment has a nozzle 95 oriented at approximately 45 degrees with respect to the top surface 12 of the substrate 10. During printing, the ink jet nozzle 95 is first moved downwardly (direction ZZ) and is then moved laterally (direction XX) to create the L-shaped patterns 92, 94. The nozzle 95 may have a tip orifice of an appropriate longitudinal (direction YY) dimension such that the entire longitudinal width "a" of an L-shape pattern, e.g. 94, is printed in a single pass. Alternatively, a number of touching, adjacent, smaller width L-shaped passes may be printed using an ink jet nozzle with a smaller opening. A typical range for dimension "a" may be about 1 μm to 100 μm. A typical length for each leg $L_1$, $L_2$ of an L-shaped pattern 92, 94 may be about 50 μm to 200 μm. Rather than moving the nozzle 90 first in a linear vertical direction then in a linear lateral direction, the inkjet nozzle 95 could be rotated about a longitudinal axis YY to produce the L-shape pattern.

Figure 9:
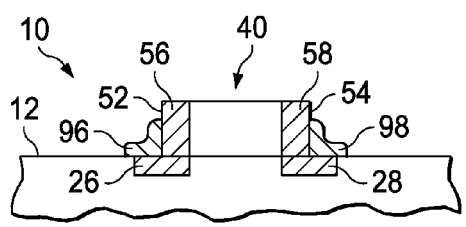
FIG. 9 is the same cross sectional elevation view as FIG. 8, except after curing of the conductive ink patterns.
Figure 10:
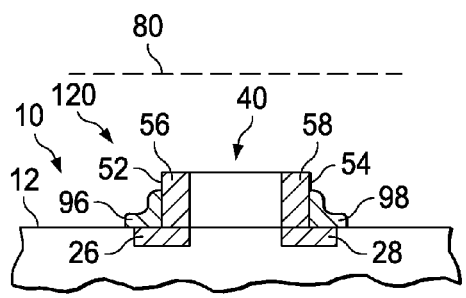
FIG. 10 is the same cross sectional elevation view as FIG. 9 except after encapsulation of the discrete device and substrate.

Next, as illustrated in FIG. 9, the assembly of FIG. 8 is moved to a curing oven where heat is applied to cure the ink providing cured L-shaped conductive ink patterns 96, 98. The curing step may take place under different conditions depending upon the type of conductive ink that is used. One type of ink that may be used is a nano-paste, which contains nano scale (e.g. 5 nm in diameter) electrically conductive particles dispersed in a base liquid medium. The use of a nano-paste, e.g. Ag nano-paste, as a conductive ink is known in the art. When the conductive ink used is a nano-paste, the curing takes place in a sintering oven at a temperature of about 125° C. to 200° C. When a conventional conductive paste is used, the heating takes place in a curing oven at a temperature of about 125° C. to 175° C. In some cases the curing is also assisted by exposure to UV light, reducing the time and temperature required.

The above-described conductive ink patterns 92, 94 may all be formed from one or more inkjet printed traces. The printing of conductive traces on a two dimensional surface using an inkjet printer is known in the art as described in U.S. patent application publication no. U.S. 2010/0059251 published Mar. 11, 2010 for "Printed Circuit Board and Manufacturing Method" of Sergey Remizov, et al.; U.S. 2010/0149249 published Jun. 17, 2010 for "Surface Treatment Method, Circuit Lines Formation Method, Circuit Lines Formation Apparatus and Printed Circuit Board Formed Thereby" of Yoon—Ah Baik, et al.; U.S. 2011/0042125 published Feb. 24, 2011 for "Conductive Ink, Method of Preparing Medal Wiring Using Conductive Ink, and Printed Circuit Board Prepared Using Method" of Jong—Hee Lee, each of which is hereby incorporated by reference for all that is disclosed therein. Inkjet printing of conductive ink traces on an electrical substrate is also disclosed in U.S. patent application Ser. No. 13/591719 filed Aug. 22, 2012 for ELECTRONIC ASSEMBLY WITH THREE DIMENSIONAL INKJET PRINTED TRACES of Mathew David Romig, et al., which is hereby incorporated by reference for all that it discloses.

Various ink formulations that may be used to inkjet print conductive traces are known in the art, such as those disclosed in the above patent publications incorporated by reference. Another such ink formulation suitable for printing conductive traces is disclosed in U.S. Patent Application U.S. 2010/0178420 published Jul. 15, 2010, which is hereby incorporated by reference for all that is disclosed therein. Other suitable inkjet ink formulations are commercially available from various manufacturers such as DuPont, Microcircuit Materials, 14 T. W. Alexander Dr., Research Triangle Park, MC 27709. One such DuPont inkjet ink is sold under the product designation 5000 Silver Conductor.

Returning now to the drawings, the next step in the process is to move the assembly of FIG. 9 to a mold compound application device such as a conventional transfer mold device (not shown) where mold compound is applied that covers substrate 10 and device 40 and a large part of any underlying lead frame (not shown) on which the substrate/ die 10 is mounted. After curing, the mold compound provides a hard protective layer of encapsulant 80. The encapsulant 80 securely and physically holds the discrete device 40 in place on the substrate 10.

Figure 11:
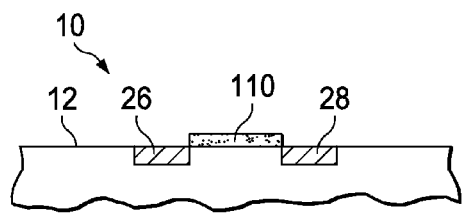
FIG. 11 is a cross sectional elevation view of a substrate with a glue pattern applied thereto.
Figure 12:
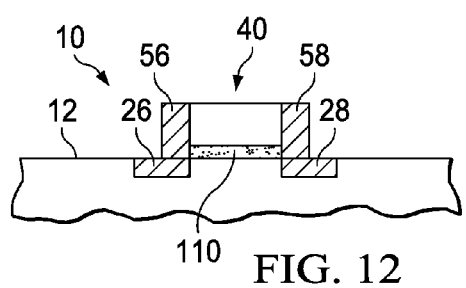
FIG. 12 is a cross sectional elevation view of a substrate with a discrete device placed on the substrate on top of the glue pattern.
Figure 13:
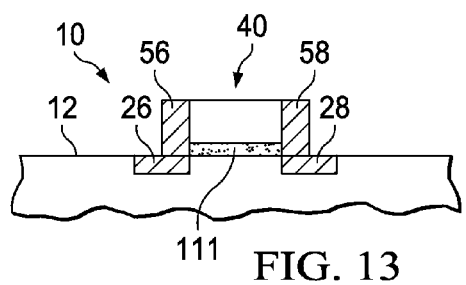
FIG. 13 is the same cross sectional elevation view as FIG. 12 except after curing of the glue pattern.
Figure 14:
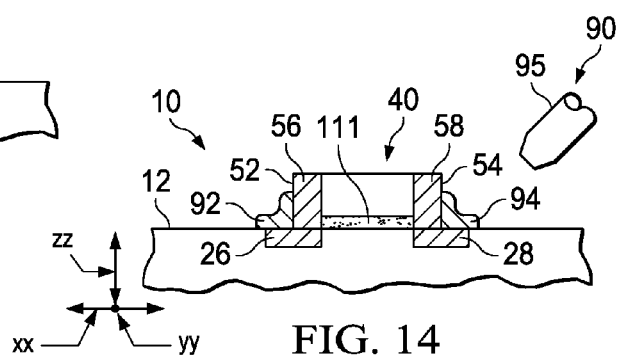
FIG. 14 is a side elevation view of a discrete device attached to a substrate with a cured glue pattern after printing of conductive ink patterns thereon.
Figure 15:
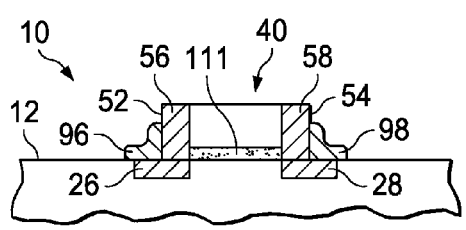
FIG. 15 is a cross sectional elevation view of the substrate and discrete device of FIG. 14 after curing of the conductive ink patterns.
Figure 16:
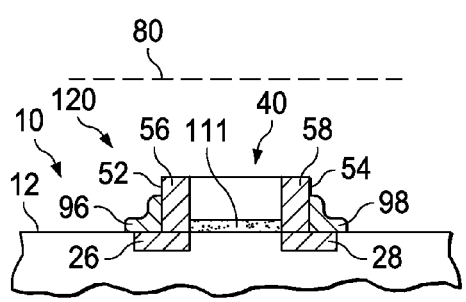
FIG. 16 is a cross sectional elevation view of the discrete device and substrate of FIG. 15 after encapsulation of the substrate and discrete device.

An alternative method of mounting a discrete device 40 on a substrate 10 is illustrated in FIGS. 11-16. In this method, as shown by FIG. 11, a first step is to apply a glue layer 110 to the substrate in the area between contact pads 26, 28. Next, as illustrated in FIG. 12, a discrete device 40 is positioned on top of the glue layer 110 with plated terminals 56, 58 thereof positioned above contact pads 26, 28. Next, as illustrated in FIG. 13, the assembly of FIG. 12 is moved to a glue curing oven which typically operates at a temperature of about 125° C. to 175° C. As illustrated by FIG. 13, the liquid glue 110 is converted to cured glue layer 111 at this stage, and thus the glue layer 111 physically holds the discrete device 40 at the position shown in FIG. 13. Next, as illustrated in FIG. 14, the assembly of FIG. 13 has L-shaped conductive ink printed thereon in the same manner as described above with reference to FIG. 8. Next, as illustrated in FIG. 15, the assembly of FIG. 14 is moved to an ink curing oven where the wet, uncured conductive ink patterns 92, 94 are converted to cured conductive ink patterns 96, 98. Next, as illustrated by FIG. 16, the discrete device 40 and substrate 10, etc., are encapsulated in a protective layer of encapsulant 80. Thus, in addition to the glue layer 111, the encapsulant 80 functions to hold the discrete device 40 in fixed position with respect to the substrate 10.

It should be noted from the above discussion of FIGS. 6-16 that the technique of mounting a discrete device 40 on a substrate 10 described herein avoids the elevated temperatures associated with use of reflow ovens in the prior art method described in reference to FIGS. 2-5. Another advantage of one embodiment of the new method is that it is not necessary to apply all of the conductors to all of the associated dies at the same time. Rather, it is a simple matter to inkjet print the conductive ink patterns 92, 94 one at a time if so desired. Another advantage of one embodiment of the new method is that the size and spacing of contact pads 26 and 28, as well as their spacing to adjacent pads on which other discrete devices would be placed, can be reduced because of the precise capabilities of the inkjet printing and epoxy curing processes.

Figure 17:
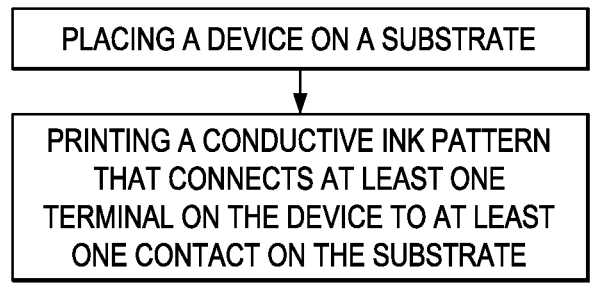
FIG. 17 is a flow chart of a method of electrically attaching a discrete device to a substrate.

FIG. 17 illustrates a method of electrically attaching a discrete device to a substrate. The method includes placing the device on the substrate and applying conductive ink that connects at least one terminal on the device that extends transversely of the substrate to at least one contact on the substrate.

Figure 18:
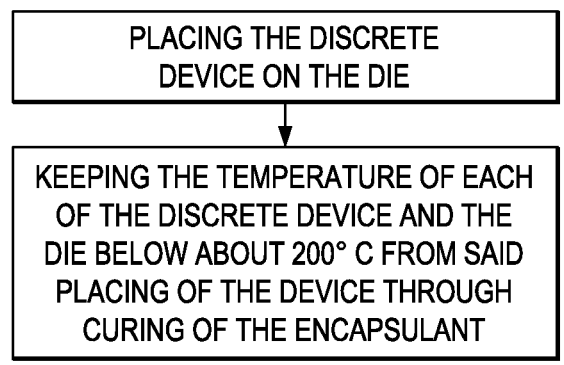
FIG. 18 is a flow chart of a method of making an electronic device having a discrete device mounted on a surface of an electronic die with both the discrete device and the die covered with cured encapsulant.

A method of making an electronic device having a discrete device mounted on a surface of an electronic die with both the discrete device and the die covered with cured encapsulant is illustrated by FIG. 18. The method includes placing the discrete device on the die and keeping the temperature of each of the discrete device and the die below about 200° C. from the placing of the device through curing of the encapsulant.

Certain embodiments of an electronic assembly having conductive ink patterns that electrically connect a discrete device to an electrical substrate and methods of making such electronic assemblies have been described in detail herein. However, it is to be understood that the electronic assemblies and method are not limited to these specific embodiments and may be otherwise constructed and practiced. Many alternative embodiments of the disclosed assemblies and methods will be apparent to those skilled in the art after reading this disclosure. It is intended that the appended claims be broadly construed so as to encompass such alternative embodiments, except to the extent limited by the prior art.

What is claimed is:

1. An IC package comprising:
   a discrete electrical device having a first surface, an opposing second surface, a plurality of third surfaces connecting said first and second surfaces, and a plurality of electrical terminals, at least one terminal of said plurality of electrical terminals substantially forming at least a portion of one of said third surfaces and extending substantially to said first surface of said discrete electrical device;
   a substrate having a first surface in direct contact with said discrete electrical device and a contact pad corresponding to said first surface of the substrate; and
   conductive ink electrically connecting said at least one terminal of said plurality of electrical terminals with said contact pad.

2. The IC package of claim 1, wherein said conductive ink has a three dimensional L-shaped configuration having a first leg touching said discrete electrical device and a second leg touching the substrate.

3. The IC package of claim 1 wherein said conductive ink comprises a nano-paste layer.

4. The IC package of claim 1 wherein said conductive ink comprises a conductive paste layer.

5. The IC package of claim 1 wherein said discrete electrical device comprises at least one of a sensor, MEMS, and oscillator.

6. The IC package of claim 1 wherein said first leg and said second leg have a cross sectional width of about 1 μm to 100 μm.

7. The IC package of claim 1 further comprising a protective layer of encapsulant over a portion of said discrete electrical device, a portion of said conductive ink, and a portion of said substrate.

8. The IC package of claim 1, said contact pad in direct contact with said discrete electrical device.

9. The IC package of claim 1, said at least one terminal located on said contact pad.

* * * * *